(12) United States Patent
Chen

(10) Patent No.: US 12,426,221 B2
(45) Date of Patent: Sep. 23, 2025

(54) EMI GASKET FOR CARD DEVICE FORM FACTORS

(71) Applicant: Quanta Computer Inc., Taoyuan (TW)

(72) Inventor: Ching-Jen Chen, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 18/594,577

(22) Filed: Mar. 4, 2024

(65) Prior Publication Data

US 2025/0280521 A1    Sep. 4, 2025

(51) Int. Cl.
*H05K 9/00* (2006.01)

(52) U.S. Cl.
CPC ......... *H05K 9/0015* (2013.01); *H05K 9/0062* (2013.01); *H05K 9/009* (2013.01)

(58) Field of Classification Search
CPC ........................... H05K 9/0015; H05K 9/0016
See application file for complete search history.

(56) References Cited

U.S. PATENT DOCUMENTS

| | | | | |
|---|---|---|---|---|
| 4,910,920 A * | 3/1990 | Nichols | ................ | H05K 9/0016 49/495.1 |
| 6,043,992 A * | 3/2000 | Scheibler | ............. | H05K 7/1461 361/728 |
| 6,395,976 B1 * | 5/2002 | Koradia | ............... | H05K 7/1409 361/801 |
| 6,483,023 B1 * | 11/2002 | Jacques | ................ | H05K 7/1425 174/358 |
| 6,660,932 B1 * | 12/2003 | Barringer | ............. | H05K 9/0015 174/358 |
| 6,714,423 B1 * | 3/2004 | Nurmi | .................. | H05K 9/0016 361/818 |
| 7,763,810 B2 * | 7/2010 | van Haaster | ......... | H05K 9/0015 174/357 |
| 10,212,863 B1 * | 2/2019 | Ball | ........................ | H05K 9/009 |
| 2006/0157273 A1 * | 7/2006 | White | .................. | H05K 9/0016 174/355 |
| 2006/0262513 A1 * | 11/2006 | Harvey | ................ | H05K 9/0062 361/816 |
| 2008/0023222 A1 * | 1/2008 | Woolsey | .............. | H05K 9/0062 174/369 |

(Continued)

FOREIGN PATENT DOCUMENTS

CN    110062569 A    7/2019
CN    214280342 U    9/2021

OTHER PUBLICATIONS

TW Office Action for Application No. 113113587 mailed Jan. 20, 2025, w/ First Office Action Summary, 8 pp.

(Continued)

Primary Examiner — Hung V Ngo
(74) Attorney, Agent, or Firm — NIXON PEABODY LLP

(57) ABSTRACT

An EMI gasket assembly is disclosed that blocks gaps between a device card and a slot in a chassis that allows insertion of the device card. The EMI gasket assembly is attachable to a front plate of the device card such as an OCP 3.0 Specification compliant device card. The EMI gasket assembly includes a fabric-over-foam gasket extending the width of the front plate. The EMI gasket assembly includes a plurality of finger gaskets attachable to the front plate. The finger gaskets are positioned to hold the fabric-over-foam gasket on the front plate.

20 Claims, 6 Drawing Sheets

(56) References Cited

U.S. PATENT DOCUMENTS

2008/0259587 A1\* 10/2008 Brench ................ H05K 9/0016
174/355
2024/0044202 A1\* 2/2024 Glover ................ H05K 9/0016

OTHER PUBLICATIONS

TW Search Report for Application No. 113113587 mailed Jan. 20, 2025, w/ First Office Action, 5 p.

\* cited by examiner

EMI GASKET FOR CARD DEVICE FORM FACTORS

TECHNICAL FIELD

The present disclosure relates generally to a gasket that protects card devices from electromagnetic interference (EMI). More particularly, aspects of this disclosure relate to a foam gasket that effectively provides EMI protection for a device card form factor.

BACKGROUND

Electronic devices, such as servers, include numerous electronic components that are powered by a common power supply. Generally, servers are directed toward specific functions such as storing large amounts of data or processing. Server design begins with a chassis that includes power components and general controllers such as a baseboard management controller. Current large server designs include expansion slots that accept expansion device cards that may be plugged in to perform additional server functions, such as storage or processing. For example, a storage server may include slots for accommodating additional solid state drive (SSD) device cards while a processing server may include slots for device cards with processing units or network interface components.

A current generation of device cards meet certain requirements such as the OCP 3.0 Specification that defines a form factor that allows the device cards to be inserted through the front of a server chassis. This allows convenient attachment of the device cards without removing the server chassis from a rack. For example, a form factor card according to the OCP 3.0 specification includes a circuit board that supports various electronic components including a network interface controller module. The circuit board has a form factor pluggable module that extends from one edge. An opposite edge of the circuit board includes an edge connector that may be inserted sideways through a slot in a front panel of a server system to mate with either a right angle socket or a straddle socket on a motherboard. When the expansion card is inserted in the chassis, the pluggable module of the card extends through an aperture on the side of the chassis. This allows communication connectors to be inserted to allow signals to be received on expansion card components such as a network interface controller.

The opposite end of the edge connector has a faceplate with different mechanisms to pull out the card such as a pull tab version, an ejector latch version, and an internal lock version. The faceplate includes the opening for the pluggable modules and various apertures for connectors and ventilation. However, the slot of the server chassis is generally larger in area to allow for insertion of the card without any physical interference. The gaps between the slot and the card may allow external electromagnetic interference (EMI) to effect internal components on the card or in the server chassis.

In order to protect the card, various mechanisms may protect the components of the card from Electromagnetic Interference (EMI). Such mechanisms are based on a principle known as a Faraday cage, which Michael Faraday introduced. A Faraday cage is an enclosed conductive housing having a zero electrical field and forms the basis of known shielding technology. As it is not practical to build an all-welded enclosure around structures such as a card faceplate, most enclosures require various openings for controls, access panels, ventilation, and the like. These gaps/discontinuities account for most of the leakage in a shielding enclosure. Discontinuities should be minimized and designed to maintain shielding effectiveness by proper seam treatment, and use of EMI shielding gaskets. Such gaskets are generally conformed to block openings in the faceplate of a card.

The function of an EMI gasket is to preserve continuity in the gap or slot of a shield. These gaskets are made from conductive materials and are strategically placed to block interfering signals from entering or exiting electronic devices. In other words, shielding not only reduces internal EMI radiation, but it also uses to limit external electrostatic discharge (ESD). Using a highly conductive material for the enclosure, gaskets have apparent advantages to seal discontinuity and help increase shielding effectiveness. Thus, EMI seals frequently are used to seal removable panels, covers, doors and removable parts such as OCP (Open Compute Project) 3.0 compliant adapter cards. Currently, OCP 3.0 compliant adapter cards are key parts of server systems for providing network interface functionality.

FIG. 1A shows a perspective view of an expansion device card 10 compliant with the OCP 3.0 form factor specification. FIG. 1B shows a side view of the card 10. The expansion device card 10 includes a faceplate 12 that has a front plate 14, a top flange 16, and a bottom flange 18. The top flange 16 and the bottom flange 18 are perpendicularly oriented to the front plate 14. The front plate 14 includes side tabs 20 and 22 that extend perpendicularly from the sides of the front plate 14. The faceplate 12 is attached perpendicularly to a rectangular circuit board 30. The front plate 14 includes various air holes for air cooling and an aperture 32 that allows modular operational components mounted on the circuit board 30 to extend outward. The top flange 16 has a series of slots 34 that allow a gasket 36 to be inserted to provide protection against EMI.

The circuit board 30 has a top surface that supports operational components such as a Quad Small Form-Factor Pluggable (QSFP) connector module 40 that includes a controller chip 42. The circuit board 30 has a heat sink 44 that is mounted over the controller 42 to assist in heat transfer away from the controller 42 and other components. The pluggable module 40 has a QSFP socket connector 46 that faces out from the respective aperture 32 of the front plate 14. A distal edge of the circuit board 30 opposite the faceplate 12 includes golden finger connectors that define an edge connector 48. The edge connector 48 is insertable into a straddle mount or right-angle connector socket on a motherboard of a computer system.

FIG. 1C is a perspective view of the OCP 3.0 expansion device card 10 in FIG. 1A installed in a server system chassis 50. In this example, the server system chassis 50 has a panel 52 that includes a slot 54 that allows the expansion card 10 to be inserted into the server system chassis 50. The socket connector 46 of the small form factor pluggable module 40 extends through the aperture 32 in the front plate 14 of the expansion card 10 and thus is accessible from outside the server system chassis 50. When the expansion card 10 is inserted fully into the slot 54, the edge connector 48 is connected to a straddle mount connector socket in the chassis 50. The slot 54 must have a sufficient cross section area to allow the card 10 to be easily inserted. Thus, even when the card 10 is attached through in the slot 54, gaps exist between the faceplate 12 and the sides of the slot 54. This may risk EMI to the internal components.

The known electro-magnetic interference (EMI) gasket 36 is fabricated from high strength metal alloys such as beryllium (CuBe). The gasket 36 includes a support structure that joins one end of a series of fingers 60 that are mounted on the top flange 16. The fingers 60 have a "C" shape to block the gap between the slot 54 and the top flange 16. Thus, the gasket 36 extends over the width of the expansion card 10. The free end of some of the fingers 60 are inserted in the slots 34 to allow the gasket 36 to be fixed to the top flange 16. A similar bottom EMI finger gasket extends over the width of the expansion card 10 and is mounted on the bottom of the front plate 14 to plug any bottom gap between the bottom flange 18 and the slot 54. The known finger strip based (finger stock) gaskets such as the gasket 36 withstand lateral shearing forces as well as perpendicular forces, for direct-compression applications. However, the disadvantage of the metal gasket 36 is that the width of the gasket 36 is defined by the number of fingers of the gasket and the overall width is a multiple of the width of the individual fingers 60. The widths available are therefore a manufacturing limitation that prevents correct sizing of the gasket 36 to plug the entire gap as the number of fingers can only approximately match the width of a slot. Thus, gaps 70 and 72 are created at both ends of the card relative to the slot 54 when the gasket 36 is attached. The gaps 70 and 72 create the possibility of unwanted EMI for the components in the server chassis.

Another alternative for device cards is a fabric-over-foam (FOF) EMI gasket. These types of gaskets provide a wide range of excellent EMI shielding performance for expansion cards. FOF gaskets are composed of electrically conductive fabric wrapped around a soft foam core and include with a conductive pressure sensitive adhesive (PSA). Such a gasket is simply joined to the top flange 16 by the pressure sensitive adhesive and serves to block off gaps in the slot 54. Compared to metal-based finger strip gaskets, which are manufactured from high strength and high conductive alloys, a FOF gasket has the advantages of low cost and ease of installation.

As shown in U.S. Pat. No. 7,763,810 B2, entitled "Fabric-Over-Foam EMI Gaskets Having Transverse Slits and Related Methods," an undesirable side effect for such gasket may be discontinuities and gaps of the gasket that reduce the conductivity of gasket. For applications where space is limited, grooves and wide flanges may not be feasible as such features may interfere with the space required for the components on the card. When shear forces on the FOF gasket are created from contact with the slot when inserting or removing the card, the adhesion of the FOF gasket to the top plate of the front plate may fail, causing movement of the EMI gasket or a decrease in the electrical contact between the EMI gasket and the front panel.

Thus, there is a need for a gasket assembly that may use existing mechanisms to protect a device card from EMI in gaps between the device card and a slot. There is also a need for a gasket assembly that may employ the flexibility of a fabric-over-foam gasket with necessary strength to withstand shear forces. There is also a need for a gasket assembly that may be attached to existing device card form factors without modifying the form factor.

SUMMARY

One disclosed example is an electro-magnetic interference (EMI) gasket assembly for attachment to a front plate of a device card. The EMI gasket assembly includes a fabric-over-foam gasket extending the width of the front plate. A plurality of finger gaskets are attachable to the front plate. The finger gaskets are positioned to hold the fabric-over-foam gasket on the front plate.

In another implementation of the disclosed example gasket assembly, the fabric-over-foam gasket is configured to contact a top planar flange of the front plate. In another implementation, the top planar flange includes a plurality of slots. An edge of each of the plurality of finger gaskets is configured to be inserted in one of the plurality of slots of the top planar flange. In another implementation, the assembly includes a bottom fabric-over-foam gasket and a bottom plurality of gaskets attachable to a bottom edge of the front plate. The fabric-over-foam gasket and plurality of finger gaskets are attached at a top edge of the front plate. In another implementation, the finger gaskets are fabricated from a metal alloy. In another implementation, the fabric-over-foam gasket includes an outer conductive fabric of metal fibers enclosing a foam core. In another implementation, the fabric-over-foam gasket includes an adhesive for adhering the fabric-over-foam gasket to the front plate.

Another disclosed example is device card including a circuit board having a connector edge and an opposite front edge. A front plate is coupled to front edge of the circuit board. The front plate and circuit board are insertable into a slot on a panel of a chassis. A fabric-over-foam gasket extends the width of the front plate. A plurality of finger gaskets are attached to the front plate. The finger gaskets are positioned to hold the fabric-over-foam gasket on the front plate. The fabric-over-foam gasket and finger gaskets block gaps between the front plate and the slot.

In another implementation of the disclosed example device card, the device card and front plate are compliant with the OCP 3.0 Specification. In another implementation, the front plate includes a top planar flange in contact with the fabric-over-foam gasket. In another implementation, the top planar flange includes a plurality of slots. An edge of each of the plurality of finger gaskets is inserted in one of the plurality of slots of the top planar flange. In another implementation, a bottom fabric-over-foam gasket and a bottom plurality of gaskets are attached to a bottom edge of the front plate. The fabric-over-foam gasket and plurality of finger gaskets are attached at a top edge of the front plate. In another implementation, the finger gaskets are fabricated from a metal alloy. In another implementation, the fabric-over-foam gasket includes an outer conductive fabric of metal fibers enclosing a foam core. In another implementation, the fabric-over-foam gasket includes an adhesive adhering the fabric-over-foam gasket to the front plate.

Another disclosed example is a computing system including a chassis having an internal connector and a panel with a slot. A device card has a circuit board, a front plate, an operating component and a connector. The device card is insertable in the slot such that the connector is connected to the internal connector. A gasket assembly is connected to the device card to shield gaps between the slot and the device card. The gasket assembly includes a fabric-over-foam gasket extending the width of the front plate. A plurality of finger gaskets are attached to the front plate. The finger gaskets are positioned to hold the fabric-over-foam gasket on the front plate.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings, in which.

Figure 1A:
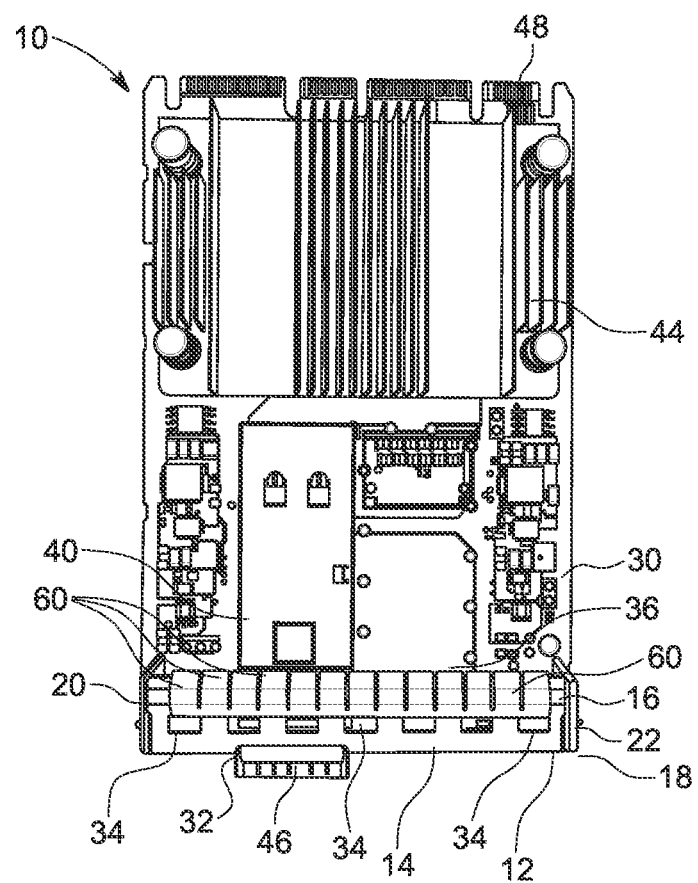
FIG. 1A is a view of a device card having a prior art finger type gasket installed.
Figure 1B:
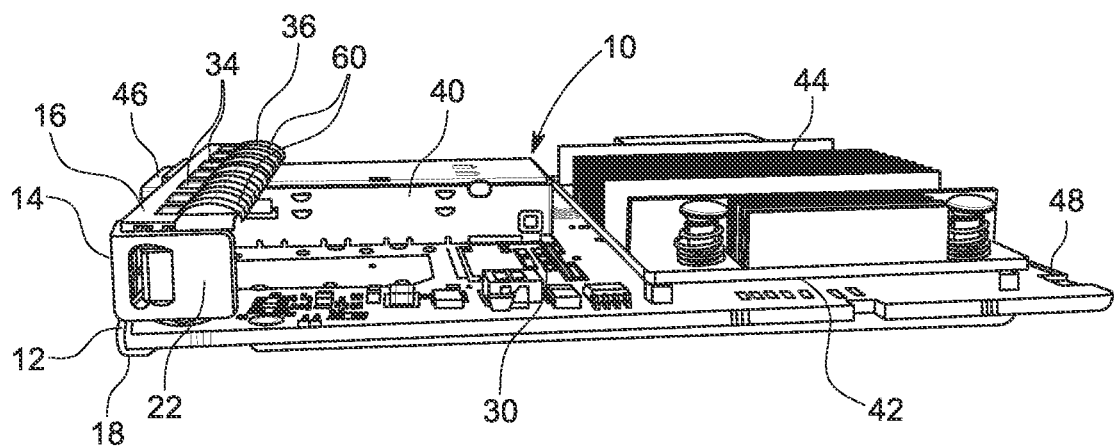
FIG. 1B is a side perspective view of the device card and prior art finger type gasket.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements, and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

The present disclosure is directed toward gasket assembly that includes a fabric-over-foam gasket in combination with metal finger gaskets that minimizes the gap/discontinuity between a device card and a panel slot. The assembly maintains shielding effectiveness by proper seam treatment, and use of EMI shielding gaskets. The assembly has the advantage of the flexibility of a fabric-over-foam gasket while leveraging the shear resistance of a metal finger gasket.

Figure 2A:
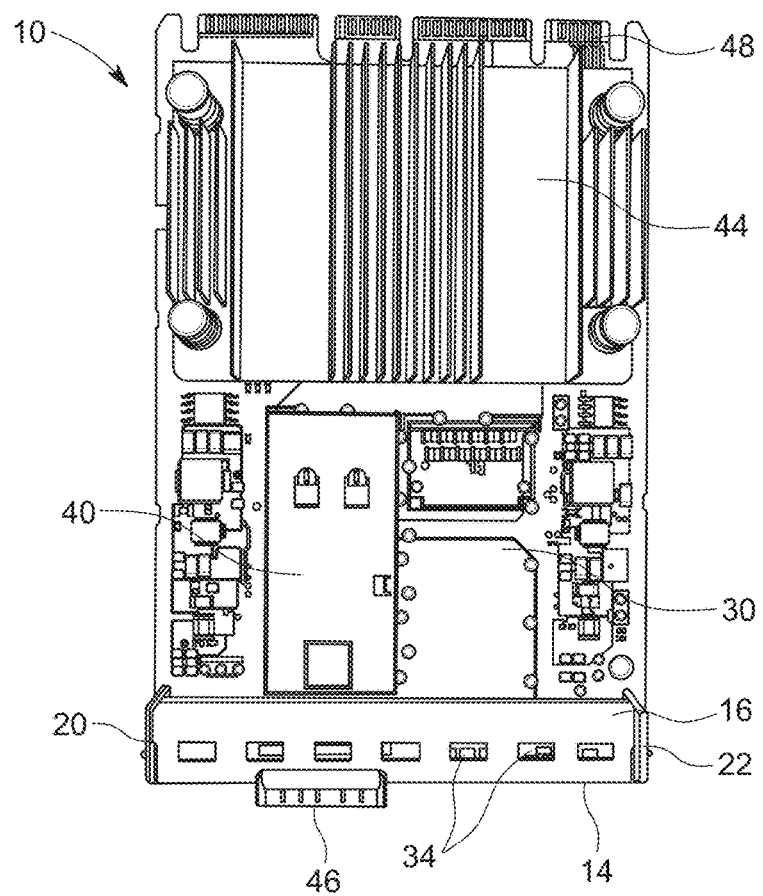
FIG. 2A is a top view of a card prior to the attachment of the example EMI protection gasket assembly.

FIG. 2A shows a view of the card 10 in FIG. 1A with the faceplate 12 without protection from EMI between the faceplate 12 and a slot where the card is inserted. Like elements in FIG. 1A are labeled with identical reference numbers in FIG. 2A. Although the example card 10 is compliant with the form factor requirements in the OCP 3.0 specification, the principles herein relating to a gasket assembly may be applied to protect any component that is inserted in a slot or aperture of a panel from EMI.

Figure 1C:
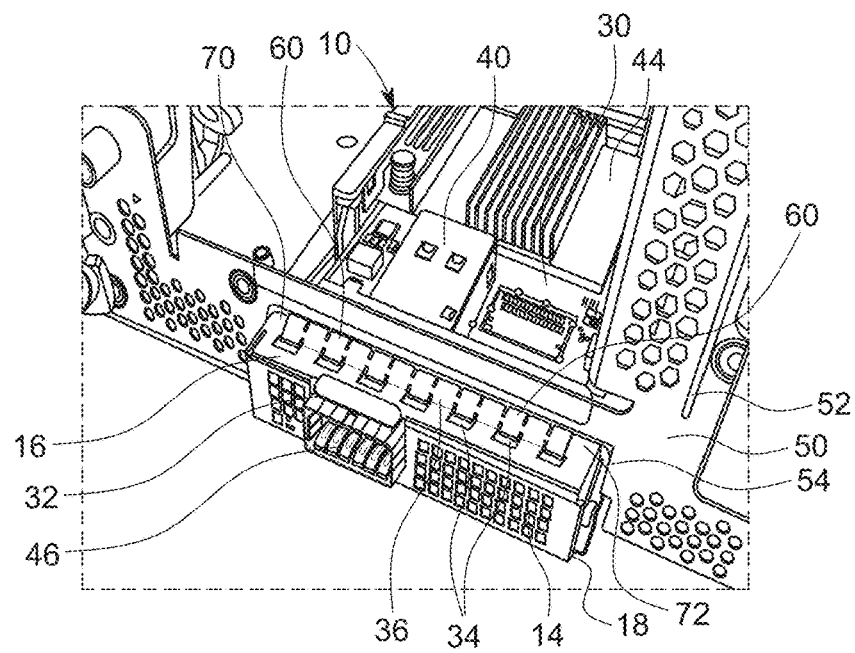
FIG. 1C is a perspective view of the device card and prior art finger type gasket in FIG. 1A inserted in a computer device.

The card 10 has a OCP 3.0 compliant form factor in FIG. 2A and is shown before installation into a computer system such as the computer system shown in FIG. 1C. As may be seen in FIG. 2A, the exterior surface of the top flange 16 of the front plate 14 extends the width of the card 10. As explained above the top flange 16 has a planar surface with the series of parallel slots 34.

Figure 2B:
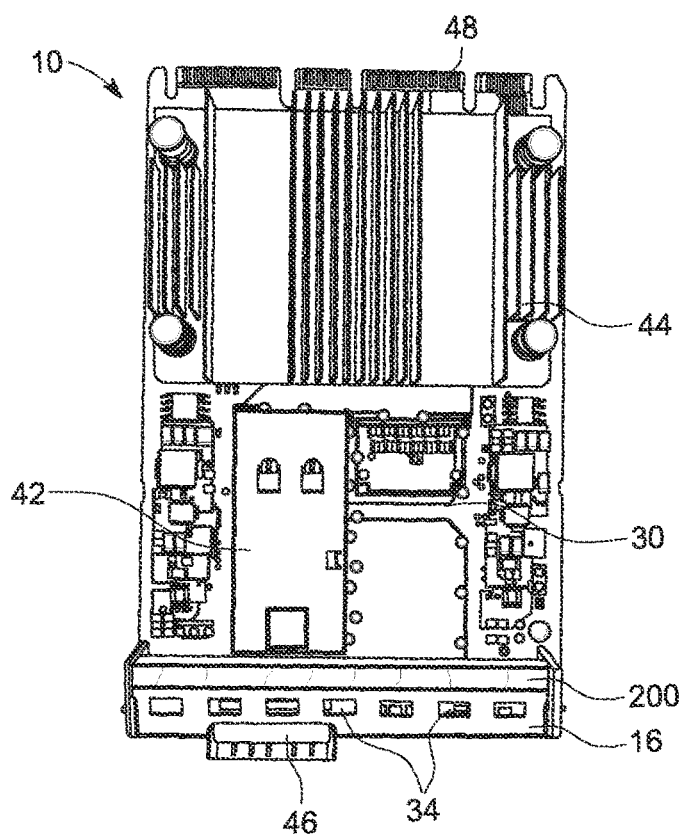
FIG. 2B is a top view of the card in FIG. 2A with an example foam on fabric gasket placed on the front plate, according to certain aspects of the present disclosure.

As shown in FIG. 2B, an example fabric-over-foam gasket 200 may be inserted over the top flange 16 in proximity to the slots 34. The fabric-over-foam gasket 200 has a length that is sufficient to match the width of the card 10. In this example, the fabric-over-foam gasket 200 has a roughly rectangular shape that may be tailored to the width of the card 10. For example, the gasket 200 may be supplied in strips that may be cut to approximately match the width of the card 10. The height of the fabric-over-foam gasket 200 is selected so the gasket 200 can fill any gap between a slot in a chassis such as the slot 54 in FIG. 1C and the top flange 16 of the front plate 14.

The fabric-over-foam gasket 200 can be compressed to fill slightly smaller gaps between the card and the slot of the computing system. Thus, the height of the fabric-over-foam gasket 200 may be slightly larger than the gap between the top flange 16 and the top of a slot in a chassis panel. In this example, the fabric-over-foam gasket 200 may have an adhesive strip that allows it to be attached to the planar surface of the top flange 16 in this example. Alternatively, the fabric-over-foam gasket 200 may be held in place by the conventional finger gaskets as will be explained that are combined with the gasket 200.

Figure 2C:
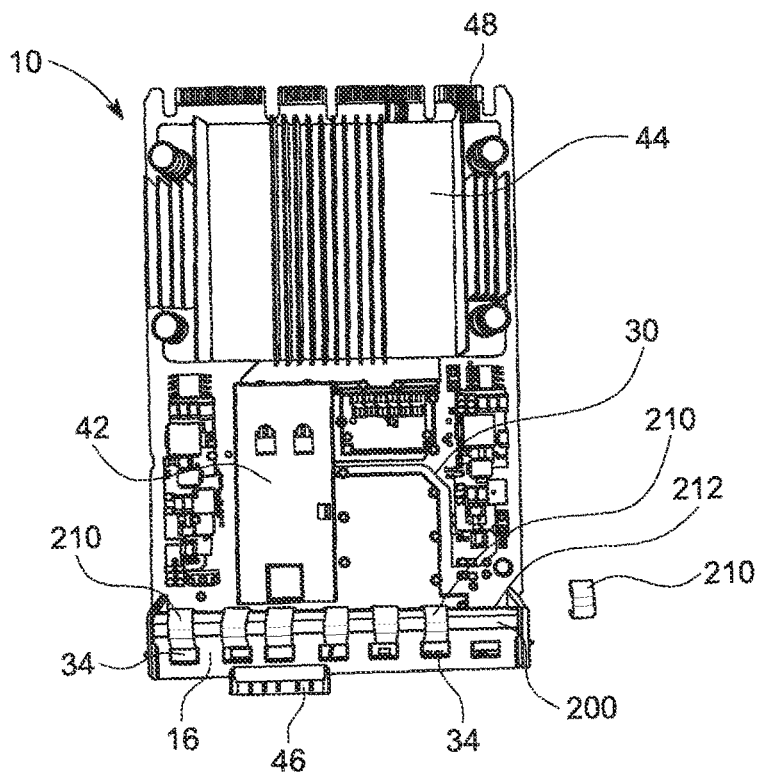
FIG. 2C is a top view of the card in FIG. 2A showing the installation of individual finger gaskets over the fabric gasket, according to certain aspects of the present disclosure.

FIG. 2C shows the installation of separate finger gaskets 210 that engage the slots 34 in the top flange 16 of the card 10. As may be seen in FIG. 2C, each of the finger gaskets 210 has opposing side edges that have a curved shape. One of the side edges is inserted in a corresponding one of the slots 34 in the top flange 16. An opposite end of the finger gasket 210 is attached to the underside of a leading edge 212 of the top flange 16. The gasket 210 has a semi-circular shape and thus may be compressed to block the gap between the top flange 16 and the top of the slot. The gasket 210 may utilize compressive force hold the fabric-over-foam gasket 200 in place. Multiple gaskets such as the gaskets 210 may be used in conduction with the slots 34.

Figure 3A:
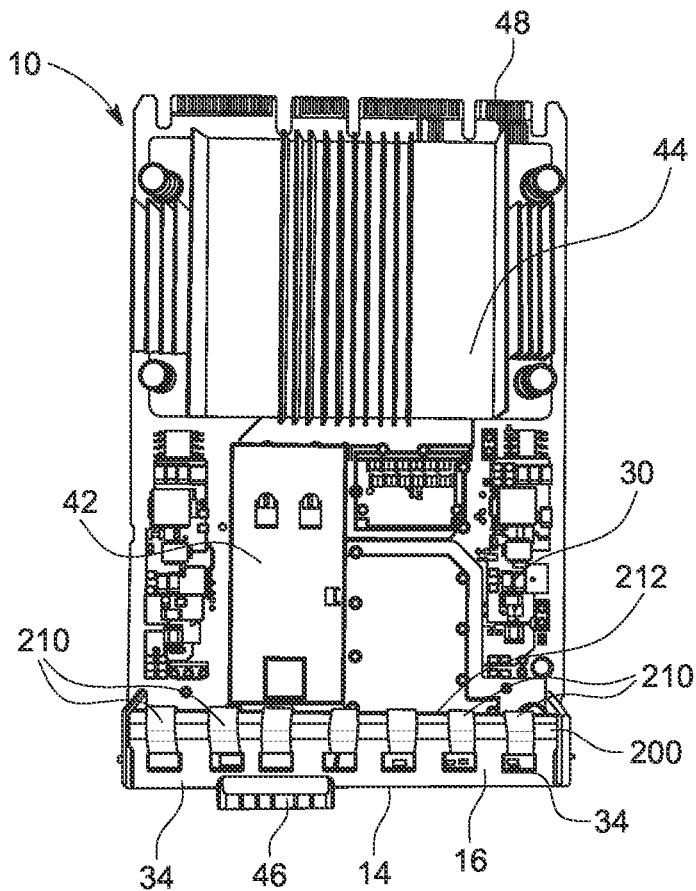
FIG. 3A is a top view of the card in FIG. 2A with the example combined finger and foam on fabric gasket assembly, according to certain aspects of the present disclosure.
Figure 3B:
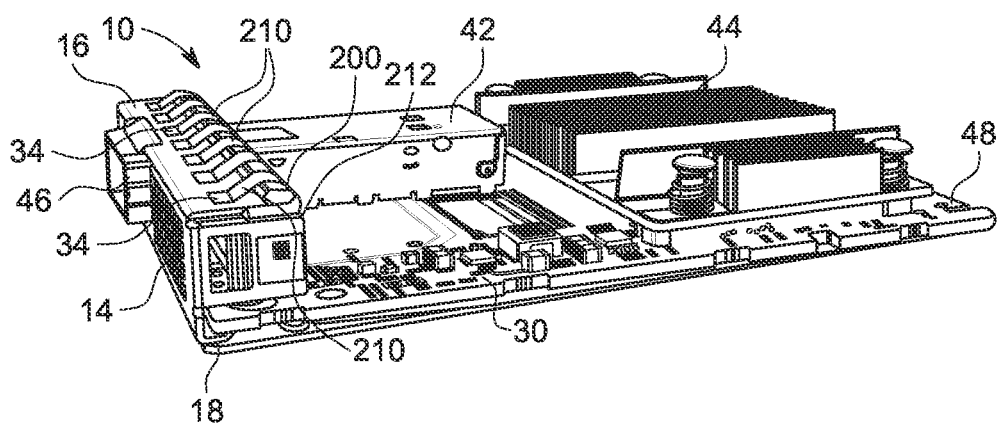
FIG. 3B is a perspective view of the card in FIG. 2A with the example combined finger and foam on fabric gasket assembly, according to certain aspects of the present disclosure.

FIG. 3A shows a top view of the card 10 with the installation of all of the finger gaskets 210 in the respective slots 34 in the top flange 16. FIG. 3B shows a perspective view of the finger gaskets 210 and the fabric-over-foam gasket 200 on the card 10. As shown in FIG. 3A-3B, the finger gaskets 210 are located over the FOF gasket 200 that extends the width of the top flange 16. The assembly of the fabric on foam gasket 200 and the finger gaskets 210 plug any gaps that may allow EMI, while have shear resistance due to the strength of the finger gaskets 210. In this example, individual finger gaskets 210 are attached to the top flange 16. However, a conventional gasket having a support member attached to one end of the finger gaskets may also be used, saving the need for individual finger gaskets.

Figure 4:
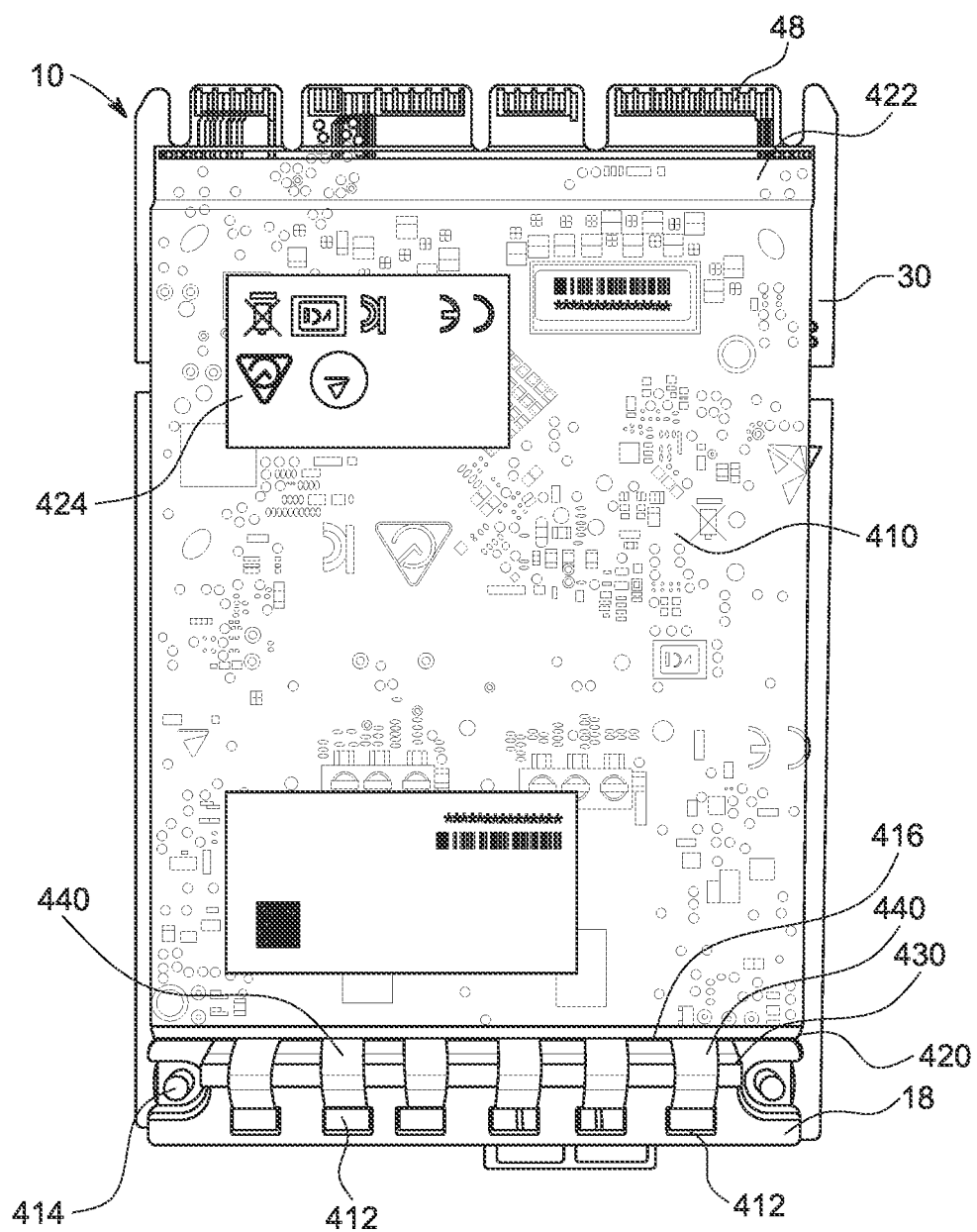
FIG. 4 is a bottom view of the card in FIG. 2A with another example combined finger and foam on fabric gasket assembly, according to certain aspects of the present disclosure.

FIG. 4 shows a bottom view of the card 10 with the installation of another gasket assembly to shield EMI from gaps in the space between the bottom of the front plate 14 and the bottom of the slot through which the card 10 is inserted. In this example, a mylar cover 410 is positioned over the bottom side of the circuit board 30 to protect against EMI and dirt and debris. The bottom flange 18 has a flat surface with slots 412. The bottom flange includes two edge indentations 414 that allow screws to be inserted to attach the bottom flange 18 to the circuit board 30. An open edge 416 of the bottom flange 18 is positioned over one end of the bottom side of the circuit board 30. One edge 420 of the mylar cover 410 is attached to the underside of the open edge 416 of the bottom flange 18. The mylar cover 410 has an opposite edge 422 that rests on the opposite end of the circuit board 30 near the edge connector 48. Labels 424 may be affixed to the mylar cover 410 to provide useful card device information.

In this example, the EMI gasket assembly in FIG. 4 includes a fabric-over-foam gasket 430 that is positioned over the width of the bottom flange 18. A series of finger gaskets 440 similar to the gaskets 210 shown in FIGS. 3A-3B have one edge inserted in the respective slots 412. The other edge is inserted around the open edge 416 to hold the respective finger gaskets 440 in place. The compressive force applied by each finger gasket 440 also servers to fix the fabric-over-foam gasket 430 in place.

Figure 5:
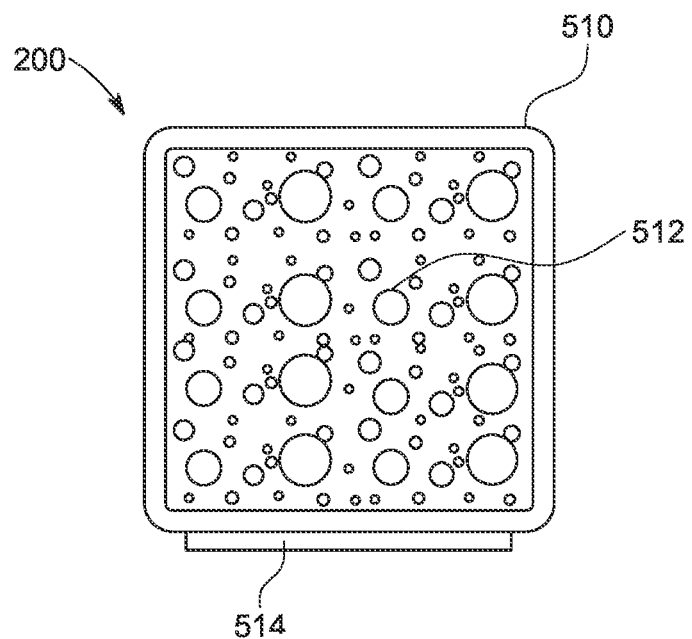
FIG. 5 is a cross-section view of the foam on fabric gasket in FIG. 2B, according to certain aspects of the present disclosure.

FIG. 5 shows a cross-section of the example fabric-over-foam gasket 200. The fabric-over-foam gasket 200 has a conductive fabric layer 510 that encloses a foam core 512. In this example the gasket 200 has a rectangular cross-section and thus the conductive fabric layer 510 forms a top, a bottom, and side panels. The conductive fabric layer 510 is electrically conductive and wrapped around the foam core 512. The conductive fabric layer 510 provides shielding attenuation and high conductivity. In this example, conductive fabric layer 510 may be Nickel/copper (Ni/Cu) woven metal fibers that ensures effective conductivity and shielding effectiveness across a spectrum of frequencies. Alternatively, the conductive fabric layer 510 may be Tin/copper (Sn/Cu) fibers for versatile galvanic compatibility and shielding. In this example, the foam core 512 structure and resilience for the gasket 200. Thus, materials for the core are those that ensure that the gasket 200 maintains its shape while exerting minimal pressure. An example material may be Polyurethane (PU) foam with low compression force. Another example of a foam material may be a soft silicone foam core, which offers good EMI shielding and grounding properties over a wide temperature range (from −40° C. to 125° C.). In this example, an adhesive strip 514 of PSA tape is attached to on the bottom of the conductive fabric layer 510. The adhesive strip 514 may be used to attach the fabric-over-foam gasket 200 to a planar surface.

Figure 6:
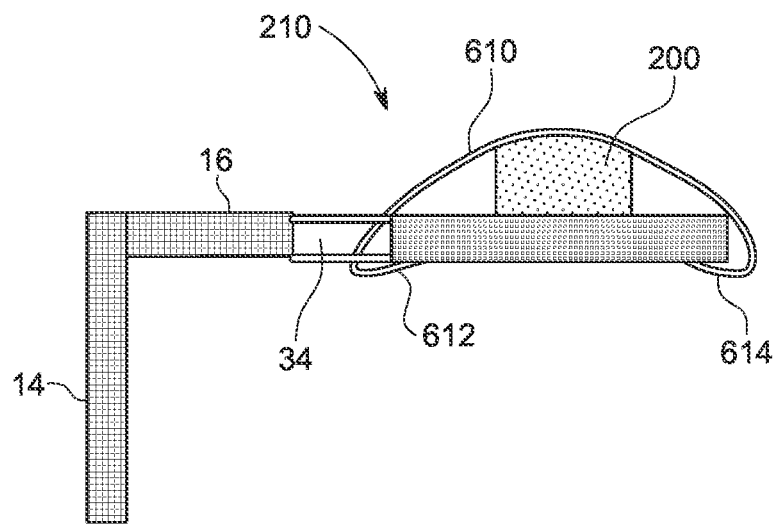
FIG. 6 is a cross-section view of one of the finger gaskets installed over the foam on fabric gasket on the top bracket of the card in FIG. 2A, according to certain aspects of the present disclosure.

FIG. 6 shows a cross-section of the engagement of one of the finger gaskets 210. In this example, the finger gasket 210 has a curved main body 610 having opposite ends 612 and 614. One of the ends such as end 612 is inserted in the slot 34 formed in the top flange 16. The end 614 is inserted under the edge of the top flange 16. As shown in FIG. 6, the compression from the finger gasket 210 partially compresses the fabric-over-foam gasket 200.

In the example gasket assembly in FIG. 3A, the EMI fabric-over-foam gasket 200 and metal alloy finger gaskets 210 constitute a gasket assembly that functions to block EMI. The gasket assembly is joined to the top flange 16 of the front plate 14 to retain and provide strength and rigidity for the gasket assembly. The flange surface geometry could be flat such as the top flange 16, or differently shaped to completely enclose the gasket.

Thus, the EMI gasket assembly includes the FOF gasket 200 and the finger gaskets 210 that can be jointly attached in the top flange 16 of any card requiring EMI shielding such as an OCP 3.0 complaint adapter card. By retrofitting a card with an existing flange with the FOF gasket 200 and finger gaskets 210, a performance advantage comes from dual functional properties of low cost and ease of installation through simple retrofit of the existing flange. Further, the assembly minimizes the gaps/discontinuities and to reduce lateral shearing forces for shielding improvement. The improvement in shielding from the example gasket assembly not only reduces EMI radiations, but also improves immunity to electro-static discharge (ESD).

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. An electro-magnetic interference (EMI) gasket assembly for attachment to a front plate of a device card, the EMI gasket assembly comprising:

a fabric-over-foam gasket extending over a width of the front plate; and a plurality of finger gaskets attachable to the front plate, wherein the finger gaskets are positioned to hold the fabric-over-foam gasket on the front plate and wherein the finger gaskets each include a curved main body with opposite ends, wherein an angled end segment extends under the curved main body from each of the opposite ends, and wherein the end segments are insertable under an edge of the front plate.

2. The assembly of claim 1, wherein the fabric-over-foam gasket is configured to contact a top planar flange of the front plate.

3. The assembly of claim 2, wherein the top planar flange includes a plurality of slots, and wherein each of the end segments each of the plurality of finger gaskets is configured to be inserted into one of the plurality of slots of the top planar flange.

4. The assembly of claim 1, further comprising a bottom fabric-over-foam gasket; and a bottom plurality of finger gaskets attachable to a bottom edge of the front plate, wherein the fabric-over-foam gasket and plurality of finger gaskets are attachable at a top edge of the front plate.

5. The assembly of claim 1, wherein the finger gaskets are fabricated from a metal alloy.

6. The assembly of claim 1, wherein the fabric-over-foam gasket includes an outer conductive fabric of metal fibers enclosing a foam core.

7. The assembly of claim 6, wherein the foam core is one of polyurethane or silicone.

8. The assembly of claim 6, wherein the fabric-over-foam gasket includes an adhesive for adhering the fabric-over-foam gasket to the front plate.

9. A device card comprising:
a circuit board having a connector edge and an opposite front edge;
a front plate coupled to front edge of the circuit board, wherein the front plate and circuit board are insertable into a slot on a panel of a chassis;
a fabric-over-foam gasket extending a width of the front plate; and
a plurality of finger gaskets are attached to the front plate, wherein the finger gaskets are positioned to hold the fabric-over-foam gasket on the front plate, and wherein the finger gaskets each include a curved main body with opposite ends, wherein an angled end segment extends under the curved main body from each of the opposite ends, and wherein the end segments are insertable under an edge of the front plate, and wherein the fabric-over-foam gasket and finger gaskets block gaps between the front plate and the slot.

10. The device card of claim 9, wherein the device card and the front plate are compliant with the OCP 3.0 Specification.

11. The device card of claim 9, wherein the front plate includes a top planar flange in contact with the fabric-over-foam gasket.

12. The device card of claim 11, wherein the top planar flange includes a plurality of slots, wherein each of the end segments of each of the plurality of finger gaskets is inserted in one of the plurality of slots of the top planar flange.

13. The device card of claim 9, further comprising a bottom fabric-over-foam gasket and a bottom plurality of gaskets are attached to a bottom edge of the front plate, wherein the fabric-over-foam gasket and plurality of finger gaskets are attached at a top edge of the front plate.

14. The device card of claim 9, wherein the finger gaskets are fabricated from a metal alloy.

15. The device card of claim 9, wherein the fabric-over-foam gasket includes an outer conductive fabric of metal fibers enclosing a foam core.

16. The device card of claim 15, wherein the foam core is one of polyurethane or silicone.

17. The device card of claim 15, wherein the fabric-over-foam gasket includes an adhesive adhering the fabric-over-foam gasket to the front plate.

18. A computer system comprising:
a chassis having an internal connector and a panel with a slot;
a device card including a circuit board, a front plate, an operating component and a connector, the device card insertable in the slot such that the connector is connected to the internal connector; and
a gasket assembly connected to the device card to shield gaps between the slot and the device card, the gasket assembly including:
a fabric-over-foam gasket extending a width of the front plate; and
a plurality of finger gaskets are attached to the front plate, wherein the finger gaskets each include a curved main body with opposite ends, wherein an angled end segment extends under the curved main body from each of the opposite ends, and wherein the end segments are insertable under an edge of the front plate, and wherein the finger gaskets are positioned to hold the fabric-over-foam gasket on the front plate.

19. The computer system of claim 18, wherein the fabric-over-foam gasket includes an outer conductive fabric of metal fibers enclosing a foam core.

20. The computer system of claim 19, wherein the foam core is one of polyurethane or silicone.

* * * * *